US009212960B2

(12) United States Patent
Lipomi et al.

(10) Patent No.: US 9,212,960 B2
(45) Date of Patent: Dec. 15, 2015

(54) NANOSTRUCTURES WITH STRAIN-INDUCED RESISTANCE

(71) Applicant: The Board of Trustees of the Leland Stanford Junior University, Palo Alto, CA (US)

(72) Inventors: Darren Lipomi, San Diego, CA (US); Michael Vosgueritchian, Mountain View, CA (US); Chee-Keong Tee, Stanford, CA (US); Sondra Hellstrom, Stanford, CA (US); Zhenan Bao, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 83 days.

(21) Appl. No.: 14/060,364

(22) Filed: Oct. 22, 2013

(65) Prior Publication Data
US 2014/0109695 A1    Apr. 24, 2014

Related U.S. Application Data

(60) Provisional application No. 61/716,807, filed on Oct. 22, 2012.

(51) Int. Cl.
| *G01L 1/26* | (2006.01) |
| *G01L 1/22* | (2006.01) |
| *G01L 1/14* | (2006.01) |
| *H01L 51/00* | (2006.01) |
| *B82Y 30/00* | (2011.01) |

(52) U.S. Cl.
CPC ............... *G01L 1/2287* (2013.01); *G01L 1/144* (2013.01); *G01L 1/22* (2013.01); *B82Y 30/00* (2013.01); *H01L 51/0048* (2013.01)

(58) Field of Classification Search
CPC .... G01L 1/144; G01L 1/2287; G01N 33/588; B82Y 30/00; H01L 51/0048
USPC ..................... 73/760, 777, 862.391
See application file for complete search history.

(56) References Cited

U.S. PATENT DOCUMENTS

| 7,137,291 | B2 * | 11/2006 | Mancevski ................... 73/105 |
| 2011/0034328 | A1 * | 2/2011 | Kang et al. .................. 502/185 |
| 2011/0192233 | A1 * | 8/2011 | Aizenberg et al. ............. 73/861 |

(Continued)

OTHER PUBLICATIONS

Jackman, R. J., Duffy, D. C., Cherniayskaya, O. & Whitesides, G. M. "Using elastomeric membranes as dry resists and for dry lift-off". Langmuir 15, 2973-2984 (1999).

(Continued)

*Primary Examiner* — Max Noori
(74) *Attorney, Agent, or Firm* — Crawford Maunu PLLC (57) ABSTRACT

Apparatuses and methods, consistent with embodiments herein, are directed to an apparatus having a stretchable substrate and a plurality of nanostructures. While the plurality of nanostructures are adhered to the stretchable substrate, the stretchable substrate and the nanostructures are stretched and/or operate in a stretched mode in which the nanostructures are characterized by a resistance corresponding to a strain imparted due to the stretching. When the substrate is relaxed or the stretching otherwise lessened, the nanostructures continue to be characterized as a function of the strain and the corresponding resistance, with buckled segments of the nanostructures being adhered along a surface of the substrate.

26 Claims, 4 Drawing Sheets

(56) References Cited

U.S. PATENT DOCUMENTS

2012/0177934 A1 7/2012 Vogel et al.
2012/0301607 A1* 11/2012 Kabir et al. ............... 427/126.1

OTHER PUBLICATIONS

Tombler, T.W., et al. "Reversible electromechanical characteristics of carbon nanotubes under local-probe manipulation". Nature 405, 769-772 (2000).

Jones, J., Lacour, S. P., Wagner, S. & Suo, Z. G. "Stretchable wavy metal interconnects". J. Vac. Sci. Technol. A 22, 1723-1725 (2004).

Bekyarova, E. et al. "Electronic properties of single-walled carbon nanotube networks". J. Am. Chem. Soc 127, 5990-5995 (2005). Abstract Only.

Someya, T. et al. "Conformable, flexible, large-area networks of pressure and thermal sensors with organic transistor active matrixes". Proc. Natl Acad. Sci. USA 102, 12321-12325 (2005).

Nosho, Y., Ohno, Y., Kishimoto, S. & Mizutani, T. "The effects of chemical doping with F(4)TCNQ in carbon nanotube field-effect transistors studied by the transmission-line-model technique". Nanotechnology 18, 415202 (2007).

Khang, D. Y. et al. Molecular scale buckling mechanics in individual aligned single-wall carbon nanotubes on elastomeric substrates. Nano Lett. 8, 124-130 (2008).

LeMieux, M. C. & Bao, Z. N. "Flexible electronics: stretching our imagination". Nature Nanotech. 3, 585-586 (2008). Abstract Only.

Dickey, M. D. et al. "Eutectic gallium-indium (EGaln): a liquid metal alloy for the formation of stable structures in microchannels at room temperature". Adv. Funct. Mater. 18, 1097-1104 (2008).

Ko, H. C. et al. "A hemispherical electronic eye camera based on compressible silicon optoelectronics". Nature 454, 748-753 (2008).

Cotton, D. P. J., Graz, I. M. & Lacour, S. P. "A multifunctional capacitive sensor for stretchable electronic skins". IEEE Sens. J. 9, 2008-2009 (2009).

Sekitani, T. et al. "Stretchable active-matrix organic light-emitting diode display using printable elastic conductors". Nature Mater. 8, 494-499 (2009).

Graz, I. M., Cotton, D. P. J. & Lacour, S. P. "Extended cyclic uniaxial loading of stretchable gold thin-films on elastomeric substrates". Appl. Phys. Lett. 98, 071902 (2009). Abstract Only.

Tahk, D., Lee, H. H. & Khang, D. Y. "Elastic moduli of organic electronic materials by the buckling method". Macromolecules 42, 7079-7083 (2009). Abstract Only.

Kim, K. S. et al. "Large-scale pattern growth of graphene films for stretchable transparent electrodes". Nature 457, 706-710 (2009).

Avouris, P. "Carbon nanotube electronics and photonics". Phys. Today 62, 34-40 (2009).

Hu, L. B., Yuan, W., Brochu, P., Gruner, G. & Pei, Q. B. "Highly stretchable, conductive, and transparent nanotube thin films". Appl. Phys. Lett. 94, 161108 (2009). Abstract Only.

Yu, C. J., Masarapu, C., Rong, J. P., Wei, B. Q. & Jiang, H. Q. "Stretchable supercapacitors based on buckled single-walled carbon nanotube macrofilms", Adv. Mater. 21, 4793-4797 (2009).

Cao, Q. & Rogers, J. A. "Ultrathin films of single-walled carbon nanotubes for electronics and sensors: a review of fundamental and applied aspects". Adv. Mater. 21, 29-53 (2009).

So, J. H. et al. "Reversibly deformable and mechanically tunable fluidic antennas", Adv. Funct. Mater. 19, 3632-3637 (2009).

Roberts, M. E., Sokolov, A. N. & Bao, Z. N. "Material and device considerations for organic thin-film transistor sensors". J. Mater. Chem. 19, 3351-3363 (2009). Abstract Only.

Bae, S. et al. "Roll-to-roll production of 30-inch graphene films for transparent electrodes", Nature Nanotech. 5, 574-578 (2010).

Feng, C. et al. "Flexible, stretchable, transparent conducting films made from superaligned carbon nanotubes". Adv. Funct. Mater. 20, 885-891 (2010). Abstract Only.

Kim, B. Y. S., Rutka, J. T. & Chan, W. C. W. "Current concepts: nanomedicine". New Engl. J. Med. 363, 2434-2443 (2010).

Kim, D. H. et al. "Dissolvable films of silk fibroin for ultrathin conformal biointegrated electronics". Nature Mater. 9, 511-517 (2010).

Kim, R. H. et al. "Waterproof AllnGaP optoelectronics on stretchable substrates with applications in biomedicine and robotics". Nature Mater. 9, 929-937 (2010). Abstract Only.

Viventi, J. et al. "A conformal, bio-interfaced class of silicon electronics for mapping cardiac electrophysiology". Sci. Transl. Med. 2, 24ra22 (2010).

Zhang, Y. Y. et al. "Polymer-embedded carbon nanotube ribbons for stretchable conductors". Adv. Mater. 22, 3027-3031 (2010).

Hu, L. B., Hecht, D. S. & Gruner, G. "Carbon nanotube thin films: fabrication, properties, and applications". Chem. Rev. 110, 5790-5844 (2010). Book Table of Contents Only.

Mannsfeld, S. C. B. et al. "Highly sensitive flexible pressure sensors with microstructured rubber dielectric layers". Nature Mater. 9, 859-864 (2010).

Takei, K. et al. "Nanowire active-matrix circuitry for low-voltage macroscale artificial skin". Nature Mater. 9, 821-826 (2010). Abstract Only.

Kubo, M. et al. "Stretchable microfluidic radiofrequency antennas". Adv. Mater. 22, 2749-2752 (2010).

Chun, K. Y. et al. "Highly conductive, printable and stretchable composite films of carbon nanotubes and silver". Nature Nanotech. 5, 853-857 (2010).

Kim, D. H. et al. "Epidermal electronics". Science 333, 838-843 (2011).

Lipomi, D. J., Tee, B. C.-K., Vosgueritchian, M. & Bao, Z. N. "Stretchable organic solar cells". Adv. Mater. 23, 1771-1775 (2011). Abstract Only.

Yu, Z. B., Niu, X. F., Liu, Z. & Pei, Q. B. "Intrinsically stretchable polymer light-emitting devices using carbon nanotubepolymer composite electrodes", Adv. Mater. 23, 3989-3994 (2011). Abstract Only.

Ilievski, F., Mazzeo, A. D., Shepherd, R. F., Chen, X. & Whitesides, G. M. "Soft robotics for chemists". Angew. Chem. Int. Ed. 50, 1890-1895 (2011).

Yamada, T., et al. "A Stretchable carbon nanotube strain sensor for human-motion detection". Nat. Nanotechnol. 6, 296-301 (2011). Abstract Only.

Zhu and Xu "Buckling of Aligned Carbon Nanotubes as Stretchable Conductors: A New Manufacturing Strategy"; Adv. Mater. 2012, 24, 1073-1077.

Xu et al. "Wavy Ribbons of Carbon Nanotubes for Stretchable Conductors" Adv. Funct. Mater. 2012.

Akter et al. "Reversibly Stretchable Transparent Conductive Coatings of Spray-Deposited Silver Nanowires"; ACS Appl. Mater. Interfaces, 2012, 4 (4), pp. 1855-1859. Abstract Only.

Xu et al., "Highly Conductive and Stretchable Silver Nanowire Conductors"; Adv. Mater. 2012, 24, 5117-5122.

Sokolov, A. N., Tee, B. C.-K., Bettinger, C. J., Tok, J. B.-H. & Bao, Z. N. "Chemical and engineering approaches to enable organic field-effect transistors for electronic skin applications." Acc. Chem. Res. (in the press). Abstract Only.

Lipomi et al., "Skin-like pressure and strain sensors based on transparent elastic films of carbon nanotubes", Nature Nanotechnology, 2011.

Kim et al., "Single-walled carbon nanotubelsilicone rubber composites for compliant electrodes", SciVerse ScienceDirect, 2011.

Bergeron, "Stanford researchers build transparent, super-stretchy skin-like sensor", http://new.stanford.edu/pr/2011/pr-stretchy-skin-like-sensor-102411.html on Dec. 1, 2011.

* cited by examiner

NANOSTRUCTURES WITH STRAIN-INDUCED RESISTANCE

FEDERALLY-SPONSORED RESEARCH AND DEVELOPMENT

This invention was made with Government support under contract 2010-1044007-000 awarded by the Central Intelligence Agency. The U.S. Government has certain rights in the invention.

Aspects of various embodiments are directed to nanostructures having strain-induced resistance.

BACKGROUND

Many different types of apparatuses and related methods have involved the use of nanostructures, which are becoming increasingly useful in both existing and developing technologies. For instance, films including nanostructures such as carbon nanotubes and graphene can be useful for applications benefitting from transparent characteristics. Such films can exhibit high conductivity while providing transparency characteristics helpful for many applications.

While useful in a variety of applications, many nanostructure-based apparatuses and films have been limited in application, in a variety of contexts. For instance, flexibility characteristics have been limited, as related to electrical performance and reliability. Further, obtaining desirable characteristics can adversely affect transparency. These and other matters have been challenging to the design, manufacture and implementation of nanostructures.

SUMMARY

Various example embodiments are directed to one or more of nanostructures, nanostructure circuits, their manufacture and their implementation.

In accordance with an embodiment, an apparatus includes a stretchable substrate and a plurality of nanostructures. While the plurality of nanostructures are adhered to the stretchable substrate, the stretchable substrate and the plurality of nanostructures are operable in a first stretched-substrate mode in which the substrate has been stretched to a first degree, and in a second mode in which the substrate is no longer stretched to the first degree. In the first mode, the nanostructures are characterized by a resistance corresponding to a strain in the plurality of nanostructures that is imparted due to and as a function of the stretching of the substrate. The nanostructures continue to be characterized as a function of the strain and the corresponding resistance in the second mode, in which the nanostructures have peak regions of buckled segments adhered along a surface of the stretchable substrate.

In accordance with another embodiment, a method is directed to coupling a plurality of nanostructures to a stretchable substrate, and operating the nanostructures and the stretchable substrate in a first stretched-substrate mode and a second mode. In the first mode, the plurality of nanostructures is characterized by a resistance corresponding to a strain in the plurality of nanostructures, by imparting the strain via stretching of the substrate to a first degree. In the second mode, the substrate is no longer stretched to the first degree and the plurality of nanostructures continues to be characterized as a function of the strain and the corresponding resistance. The nanostructures also have peak regions of buckled segments being adhered along a surface of the stretchable substrate.

Another embodiment is directed to a method in which a resistance is imparted to a plurality of nanostructures coupled to a stretchable substrate by straining the nanostructures via stretching of the substrate to a first degree, using semi-adhesive coupling between the stretchable substrate and the nanostructures to strain the nanostructures. The nanostructures are configured with a range of resistances that varies less than 25% of a value of the imparted resistance while the substrate is stretched and relaxed between an un-stretched mode and a stretched mode in which the substrate is stretched to the first degree.

In more particular embodiments, methods, apparatuses or systems are directed to high-aspect-ratio nanostructures (e.g., carbon nanotubes and/or silver nanowires) that are coupled to a surface of a stretchable substrate (e.g., as may also be flexible), and configured with a strain-induced resistance that is fixed over a range of strain values. In various embodiments, this strain is configured via, and/or an apparatus is configured for, iteratively manipulating the flexible substrate to iteratively strain and relax the nanostructures along different directions. Such straining and relaxing may, for example, include cyclically straining and relaxing the nanostructures a number of times (and, e.g., in a number of directions) to set an optimum morphology of the nanostructures that fixes the strain-induced resistance.

In accordance with one or more embodiments, strain induced as discussed above may involve strain along two or more axes, and may be implemented with a film of nanostructures having varied orientation (e.g., random, or isotropic orientation). This strain can be imparted upon nanostructures having been semi-adhesively coupled to a stretchable substrate, via manipulation (e.g., stretching, bending or other manipulation) of the substrate in various manners and along various directions. Such a film of nanostructures may, for example, include a one-dimensional film in which the nanostructures extend in a wave-like manner along a plane, with the wave-like manner being imparted via an initial application of cyclic strain, along various directions of the stretchable substrate. These approaches can be implemented to set a fixed resistance of the nanostructures, relative to subsequent application of strain along about any direction.

Various embodiments are directed to applications such as those involving a touch screen, a prosthetic limb, a robotics apparatus, solar cell, artificial skin, or a sensor having a conductive carbon nanotube structure having strain-induced resistance. For information regarding details of other embodiments, experiments and applications that can be combined in varying degrees with the teachings herein, reference may be made to the teachings and references provided in Appendix A of the underlying U.S. provisional patent application, which is fully incorporated herein.

The above discussion/overview is not intended to describe each embodiment or every implementation of the present disclosure. The figures and detailed description that follow also exemplify various embodiments.

DESCRIPTION OF THE FIGURES

The disclosure may be more completely understood in consideration of the detailed description of various embodiments of the disclosure that follows in connection with the drawings, each being consistent with one or more of these embodiments, in which FIGS. 1A-1C show plots of change in resistance over degrees of strain, as may be implemented in accordance with one or more embodiments, in which FIG. 1A shows an evolution of the change in resistance ($\Delta R/R_o$) as a function of strain for respective stages of applied strain and relaxation, FIG. 1B shows an embodiment in which respective cycles of strain are applied and in which the resistance increases reversibly, FIG. 1C shows an embodiment in which R changes over the course of many stretching cycles;

FIGS. 2A-2D show a series of schematic diagrams depicting the change in morphology of nanotubes, as may be implemented in various embodiments, and in which FIG. 2A shows a deposited film of nanotube bundles, FIG. 2B shows the nanotube film under strain, FIG. 2C shows a nanotube film having a strain relaxed to produce waves in bundles, and FIG. 2D shows a nanotube film in which biaxial stress has been applied along two or more axes;

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims.

DETAILED DESCRIPTION

Aspects of the present disclosure are believed to be applicable to a variety of different types of apparatuses, systems and methods involving strained nanostructures. While not necessarily so limited, various aspects may be appreciated through a discussion of examples using this context.

Various embodiments are directed to transparent, conducting films of nanostructures, such as single-walled carbon nanotubes or metallic (e.g., silver or copper) nanowires, carbon nanofibers, or a hybrid of two or more nanostructures, which are rendered stretchable by applying strain along one or more axes and releasing this strain. The films may be formed in a variety of manners, such as by spray-depositing or spin-coating. The application of strain imparts an increased resistance to the nanostructures that exhibits relatively low variation upon subsequent stretching. For instance, various nanostructures exhibit high increases in resistance upon stretching by relatively small amounts. By straining the nanostructures to a highly-strained condition (e.g., up to and/or beyond 100% strain) and then releasing the nanostructures, a resistance is imparted to the nanostructures that is higher than a resistance in an unstrained state yet varies relatively little upon subsequent stretching (e.g., to near the highly-strained condition).

In accordance with another embodiment, an apparatus includes a plurality of nanostructures such as nanotubes or nanowires, having a resistance that exhibits stability over a range of strain applied to the nanostructures. This stability in resistance is imparted via straining and relaxing of the nanostructures, and provides a greater degree of stability relative to a range of resistances exhibited by the nanostructures prior to the straining and relaxing (e.g., large changes in resistance are mitigated). The nanostructures may include one or more types of materials, such as nanotubes and nanowires.

In some embodiments, the nanostructures are adhered to a stretchable substrate, and the stretchable substrate and the plurality of nanostructures are operated in a first stretched-substrate mode in which the plurality of nanostructures are characterized by a resistance corresponding to a strain in the plurality of nanostructures. This strain is imparted due to and as a function of the substrate having been stretched to a first degree. The nanostructures are then operated in a second mode in which the nanostructures are no longer stretched (e.g., when the substrate is no longer stretched to the first degree and/or the nanostructures are relaxed and coupled to a different substrate). In the second mode, the plurality of nanostructures continues to be characterized as a function of the strain and the corresponding resistance. Where coupled to the stretchable substrate, the nanostructures have peak regions of buckled segments adhered along a surface of the stretchable substrate.

In various embodiments, stretching approaches as described herein are used to produce spring-like structures in nanotubes or other nanostructures. These spring-like structures can accommodate strains of up to and beyond 150% and demonstrate conductivities as high as 2,200 S cm$^{-1}$ in the stretched state. Using these approaches, the nanostructures may be strained to at least 120%, at least 150%, at least 200%, or at least 500% to impart the resistance.

In a more particular embodiment, nanostructures are configured with a resistance that is set by a degree of strain imparted to the nanostructures in a stretched substrate mode as described above. In the second mode, the plurality of nanostructures are configured to exhibit a resistance that varies less than about 25% from the resistance set in the first stretched-substrate mode. In some implementations, such an approach is carried out in which the second mode involves subjecting the substrate to a degree of stretching that is between an un-stretched condition and the first degree of stretching. In other implementations, the nanostructures are configured with the substrate to stretch and release in the second mode, within a degree of stretching that is less than the first degree, while maintaining the resistance of the nanostructures at an about constant resistance, less than about 10% variance in resistance, or less than about 25% variance in resistance.

Buckling is imparted to the nanostructures in a variety of manners. In some embodiments, the buckled segments are strained segments of the nanostructures that unbuckle upon subsequent stretching of the substrate toward the first degree, while being adhered along the surface of the stretchable substrate. For instance, regions of the nanostructures that are strained when the substrate is stretched to a first degree, are imparted with a longer length (relative to an unstrained length), with the buckles forming as ends of the (now longer) nanostructures are brought toward one another.

In some implementations, buckling in this regard and/or otherwise is facilitated via semi-adhesive coupling between the stretchable substrate and the nanostructures. This coupling facilitates the application of tensile forces to the nanostructures as the substrate is stretched while allowing portions of the nanostructures to slip along the substrate (e.g., upon release of the stretched substrate, as may be applicable to an elastic substrate that is reversibly stretchable).

Another embodiment is directed to the implementation of nanowires or nanotubes as some or all of the nanostructures, in which strain is imparted in at least two directions along the surface of the stretchable substrate. In this context, nanowires aligned along each direction and/or a direction therebetween are strained. The strained nanowires exhibit a resistance that is about constant (e.g., within 10%, or within 25%) over a range of degree of stretching between about zero and the first degree of stretching. These and other applications may involve, for example, high-aspect-ratio nanostructures having a length and thickness in which the length is at least ten times the thickness.

In a more particular embodiment, the nanostructures include a one-dimensional film of nanostructures semi-adhesively coupled to the surface of the stretchable substrate. The film lies about parallel to the stretchable substrate, and the nanostructures extend in a wave-like manner along a plurality of directions within the one-dimensional film. The applied strain is a biaxial strain applied along different directions relative to the substrate, which facilitates stretching of the substrate and/or nanostructures in different directions.

In some embodiments, a second such substrate and nanostructure film is applied facing the aforementioned substrate, with the nanostructure films forming respective electrodes. Such embodiments may, for example, be implemented in a sensor application in which the electrodes are separated by a dielectric and are used to sense capacitance. The dielectric may include a stretchable material between the films that stores electrical charge based upon a degree of compression, with the electrodes interacting with the stored electrical charge and providing an output indicative of the degree of compression via the stored electrical charge. In some implementations, a detector is coupled to the films and uses an output from each of the respective films and an indicated pattern of pressure to determine a degree of extension or compression of the stretchable material.

Various method-based approaches may be implemented in accordance with embodiments herein. In one embodiment, one or more types of nanostructures are coupled to a stretchable substrate and operated in a stretched-substrate mode in which the nanostructures are characterized by a resistance corresponding to a strain in the plurality of nanostructures, with the strain being imparted via stretching of the substrate to a first degree. The nanostructures and substrate are operated in a second mode in which the substrate is no longer stretched to the first degree, and in which the nanostructures continue to be characterized as a function of the strain and the imparted resistance. In the second state, the nanostructures have peak regions of buckled segments adhered along a surface of the stretchable substrate. Once formed, the nanostructures may be removed from the stretchable substrate, and implemented with another substrate or otherwise.

In some embodiments, the nanostructures are strained by stretching the stretchable substrate in one or more directions to impart the resistance to the nanostructures. In some implementations, the strain is used to limit variations in resistance to less than about 25% under conditions in which the stretchable substrate is stretched to a degree that is less than or equal to the first degree (e.g., in the second or a subsequent mode).

The resistance can be set to suit particular applications. In some embodiments, strain is imparted to set the resistance to a value that varies less than about 10% when operating in the second mode, in which the substrate is stretched and relaxed between an un-stretched condition and the first degree of stretching. In certain embodiments, the resistance is set to vary less than about 25% over the indicated range, or over a greater range.

In some embodiments, the stretchable substrate is iteratively manipulated to cyclically strain and relax the nanostructures, thereby setting morphology of the nanostructures that sets strain-induced resistance to a range of values that is less than a strain-induced resistance of the nanostructures after a first cycle of straining and relaxing and that varies less than about 25%. Iteratively manipulating the stretchable substrate may include stretching and buckling the nanostructures along at least two axes and imparting a wave-like structure to the nanostructures. The semi-adhesive coupling between the substrate and the nanostructures is used to allow a portion of the nanostructures to slip relative to the substrate while the nanostructures are strained via stretching of the substrate, and buckle the nanostructures into the wave-like structure upon release of the stretched substrate. The wave-like structure has an amplitude of waves per length set based upon a degree to which the nanostructures are strained by the stretchable substrate.

A variety of types of nanostructures may be implemented with various approaches herein. In some embodiments, the nanostructures have a length and a thickness in which the length is at least ten times the thickness. The nanostructures and the stretchable substrate are operated in the first stretched-substrate mode using semi-adhesive coupling between the stretchable substrate and the plurality of nanostructures to strain the nanostructures, as the stretchable substrate is being stretched. This deforms the nanostructures in length, and the segments are buckled upon operating the plurality of nanostructures and the stretchable substrate in the second mode (e.g., by releasing the substrate). This buckling occurs via releasing the stretched substrate, in which the substrate returns to an un-stretched state, and using semi-adhesive coupling to cause buckling of the nanostructures.

In a more particular embodiment, a semi-adhesive layer is formed on the stretchable substrate, and the nanostructures are coupled to the semi-adhesive layer. This semi-adhesive layer facilitates the semi-adhesive coupling of the nanostructures and substrate as described herein.

The nanostructures described herein may be implemented in connection with a variety of different types of devices. For instance, various embodiments are directed to nanotube films as electrodes in arrays of transparent, stretchable capacitors, which behave as pressure and strain sensors. Some embodiments are directed towards transparent, elastic conductors as components of electronic and optoelectronic devices that facilitate human interaction and biofeedback, such as interactive electronics, implantable medical devices, and robotic systems with human-like sensing capabilities. Many implementations are directed to apparatuses involving one or more of: skin-like sensors that stretch reversibly, pressure sensing (e.g., an amount of pressure, in addition to touch), bending into hairpin turns, integration with collapsible, stretchable and mechanically robust displays and solar cells, and wrapping around non-planar and/or biological surfaces such as skin and organs (e.g., without wrinkling).

In some embodiments, conductive, transparent, stretchable nanotube films are produced by spray-coating (e.g., nanotube length=2-3 µm) directly onto a substrate of poly (dimethylsiloxane) (PDMS, activated by exposure to ultraviolet/$O_3$) from a solution in N-methylpyrrolidone. Desirable values of Rs and σ are obtained by spin-coating a solution of charge-transfer dopant (tetrafluorotetracyanoquinodimethane (F4TCNQ) in chloroform) over the films. Doped and undoped films exhibited similar electromechanical behavior. Values of Rs=328 $\Omega sq^{-1}$ and T=79%, and maximum values of σ=1,100 S $cm^{-1}$ for a 100 nm film with T=68%, at 0% strain.

Various example embodiments are directed to high-aspect-ratio nanostructures (e.g., carbon nanotubes and/or silver nanowires) that are coupled to a surface of a stretchable substrate (e.g., elastic) and which are configured with a strain-induced resistance that is fixed over a range of strain values, by iteratively manipulating the stretchable substrate to iteratively strain and relax the nanostructures along different directions. The nanostructures may be coupled to the surface of the stretchable substrate by, for example, coating the nanostructures on the surface, growing the nanostructures from a precursor on the surface, and laminating the nanostructures on the surface. After straining/relaxing the nanostructures, the nanostructures may be embedded in or coupled to a further material for use.

Such straining and relaxing may, for example, include cyclically straining and relaxing the nanostructures a number of times (and, e.g., along two or more directions) to set an optimum morphology of the nanostructures that fixes the strain-induced resistance. The number of cycles can be set such that the resulting resistance of the nanostructures is less than a strain-induced resistance of the nanostructures after a first cycle of straining and relaxing, and less than a strain-induced resistance that the nanostructures would exhibit if the nanostructures were subjected to additional cyclic straining and relaxing. In some implementations, these approaches are used to program a fixed resistivity of the nanostructures by iteratively straining the nanostructures to a set strain, therein setting the resistance of the nanostructures to a value that remains about constant while the nanotubes are subjected to strain of less than the set strain. The straining and relaxing may be implemented as a function of the length of nanotubes used, or as a function of a maximum failure strain of the substrate upon which the nanotubes are attached (e.g., with the substrate elasticity limiting the amount of strain).

In a more particular embodiment, the nanostructures are coupled to a stretchable substrate as above to facilitate semi-adhesion between the nanostructures and the stretchable substrate as the substrate is manipulated. The nanostructures are strained by manipulating the substrate and using the interaction between the nanotubes and the substrate to strain the nanotubes. In some implementations, such semi-adhesion is implemented by surface-treating the surface of the stretchable substrate with an ultraviolet ozone treatment, prior to semi-adhesively coupling the nanostructures to the treated surface. In other implementations, the surface is coated with a semi-adhesive layer, prior to coupling the nanostructures thereto.

In a more particular embodiment, the nanostructures are buckled to impart a wave-like structure to the nanostructures. The semi-adhesive coupling between the substrate and the nanostructures is used to apply and relax strain while also allowing a portion of the nanostructures to slip relative to the substrate. The wave-like structure is implemented upon release of the stretched substrate, and has an amplitude of waves per length set based upon a degree to which the nanostructures are strained by the stretchable substrate.

Various embodiments are directed to using carbon nanotubes or other nanostructures bent or buckled to act as spring-like structures, for a stretchable, transparent skin-like sensor. The sensor can be stretched to more than twice its original length and bounce back to its original shape, and can sense pressure from a firm pinch to thousands of pounds. The sensor may be implemented in prosthetic limbs, robotics and touch-sensitive computer displays. In some implementations, a sensor uses a transparent film of single-walled carbon nanotubes, and are implemented to measure the force upon the sensor, whether it's being pulled or squeezed, and can be implemented without permanent deformation. When the nanotubes are airbrushed onto the silicone, they tend to land in randomly oriented little clumps. When the silicone is stretched, some of the bundles get pulled into alignment in the direction of the stretching. When the silicone is released, it rebounds back to its original dimensions, but the nanotubes buckle and form little nanostructures that look like springs. After this pre-stretching, the nanotubes behave like springs and can be stretched repeatedly, without any permanent change in shape. Stretching the nanotube-coated silicone in the direction perpendicular to the first direction causes some of the other nanotube bundles to align in the second direction. This renders the sensor stretchable in various directions with total rebounding afterward. The same conductivity can thus be maintained in both the stretched and unstretched forms.

In some implementations, a sensor includes two such layers of the nanotube-coated silicone, oriented so that the coatings are face-to-face, with a layer of a more easily deformed type of silicone between them. The middle layer of silicone stores electrical charge, much like a battery. When pressure is exerted on the sensor, the middle layer of silicone compresses, which alters the amount of electrical charge it can store. That change is detected by the two films of carbon nanotubes, which act like the positive and negative terminals. In some implementations, the change sensed by the nanotube films is used to transmit what it is "feeling." Whether the sensor is being compressed or extended, the two nanofilms are brought closer together and the pattern of pressure is used to detect compression and expansion. With compression, the greatest deformation is at the center and decreasing farther from the center. Under expansion/stretching, the greatest deformation is along the direction of expansion/stretch. These characteristics are used to detect the respective compression/extension.

Another example embodiment is directed to providing high-aspect-ratio nanostructures (e.g., carbon nanotubes and/or silver nanowires) semi-adhesively coupled to a surface of a stretchable substrate, and iteratively stretching and relaxing the stretchable substrate while allowing slip between a portion of the nanostructures and the substrate. The semi-adhesive coupling between the nanostructures and the surface of the stretchable substrate is used to strain and relax the nanostructures (e.g., by causing some stretch and relaxation of the nanostructures while also allowing some slip), and therefrom configuring the nanostructures to exhibit a fixed resistance over a range of strain values. In various implementations, straining and relaxing the nanostructures includes buckling the nanostructures along a plane of the surface of the stretchable substrate, via the allowed slip.

Another example embodiment is directed to an apparatus including a stretchable substrate and a film of high-aspect-ratio nanostructures (e.g., carbon nanotubes and/or silver nanowires) semi-adhesively coupled to a surface of the stretchable substrate. The film and the substrate surface are operable to iteratively strain and relax the nanostructures responsive to stretching and relaxing of the stretchable substrate, using the semi-adhesive coupling to strain the nanostructures while allowing slip between a portion of the nanostructures and the substrate, and thereby configure the nanostructures to exhibit a fixed resistance over a range of strain values. Such a film of nanostructures may, for example, include a one-dimensional film in which the nanostructures extend in a wave-like manner along a plane. In some implementations, the high-aspect-ratio nanostructures are oriented in different directions, and exhibit strain/relaxation along at least two axes.

Another embodiment is directed to an apparatus including a stretchable substrate and a film of high-aspect-ratio nanostructures (e.g., carbon nanotubes and/or silver nanowires) semi-adhesively coupled to a surface of the stretchable substrate and exhibiting a strain that sets a fixed resistance over a range of strain values as the stretchable substrate is stretched along at least two directions. Such a film may, for example, be a one-dimensional film in which the nanostructures extend in a wave-like manner along a plane.

In a more particular embodiment, a second such stretchable substrate and nanostructure film are aligned such that the surfaces upon which the films are formed face one another. Another stretchable material is between the films of nanostructures and stores electrical charge based upon a degree of compression of the third stretchable material. The films of nanostructures detect the stored electrical charge and provide an output indicative of the degree of compression via the detected stored electrical charge. In certain embodiments, such an apparatus also includes a detector that is coupled to the films of nanostructures and uses the outputs from the respective films and an indicated pattern of pressure to determine a degree of extension or compression of the third stretchable material.

Various embodiments are directed to imparting strain-induced resistance to the carbon nanotubes, independent from a density of the carbon nanotubes. In connection with these embodiments, it has been discovered that strain-induced resistance can be applied to carbon nanotubes at various densities upon a stretchable substrate, to set the resistance independent of the substrate.

In some embodiments, stretchable, transparent conductors as discussed herein are integrated into interactive optoelectronic devices and sensors for biofeedback. In some such embodiments, transparent and stretchable parallel-plate capacitors each include a strain-induced film as discussed herein, and which manifest changes in pressure and strain as changes in capacitance. The structures may be implemented with a transparency to suit the particular application, such as less than about 50% transparency (e.g., where passing light is not a need), greater than about 50% transparency, greater than about 80% transparency, and greater than about 90% transparency (e.g., for touch screens).

Figure 1A:
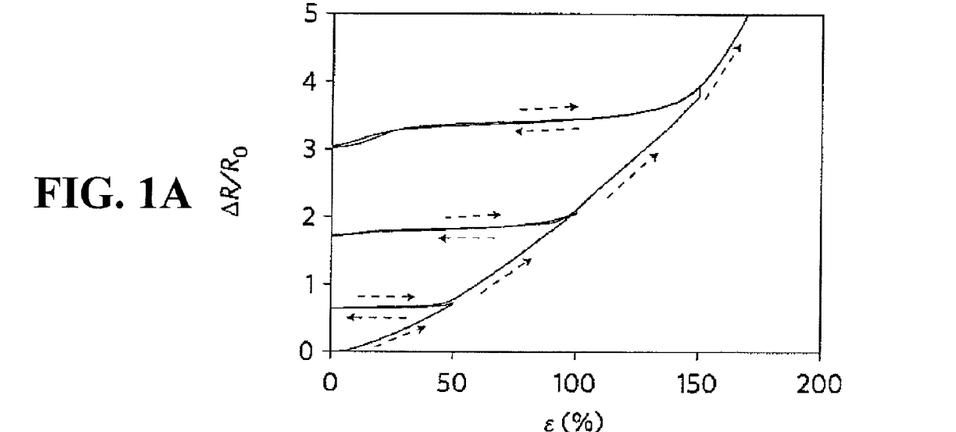
Figure 1B:
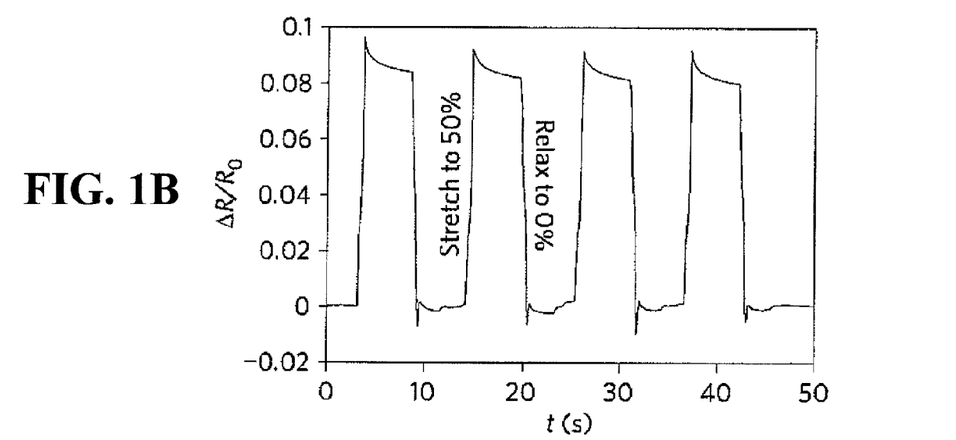
Figure 1C:
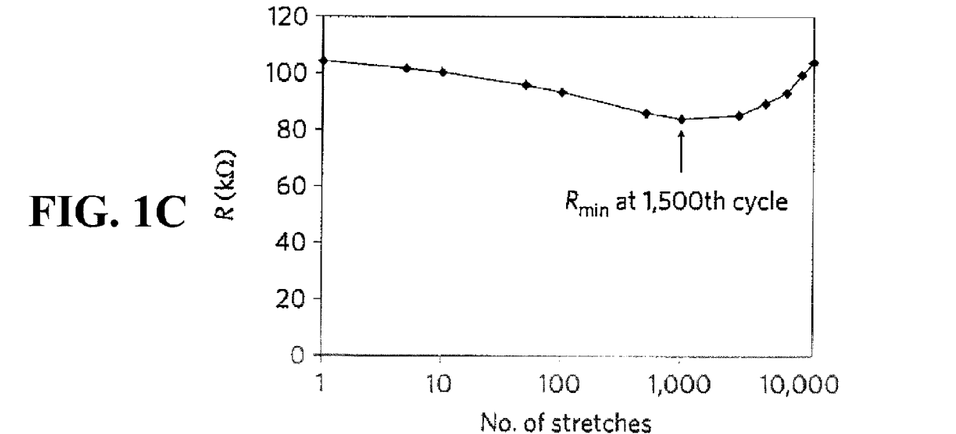

Turning now to the Figures, FIGS. 1A-1C show plots of change in resistance over degrees of strain, as may be implemented in accordance with one or more embodiments. FIG. 1A shows an evolution of the change in resistance ($\Delta R/R_0$) as a function of strain for seven stages of applied strain and relaxation in accordance with an example embodiment. The applied strain and relaxation is as follows: 0%→50%→0%→100%→0%→150%→0%→200%. With the first application of 50% strain, R increases by 0.71, which may relate to an irrecoverable loss of junctions between nanotubes. When the film is returned to 0% strain, $\Delta R/R_0$ decreases to 0.64 (as opposed to 0, its original value). Following the application of 100% strain, the resistance retraces itself until it reaches 50% (the previous maximum strain), after which the slope of DR/R0 increased. Similar behavior may be observed when relaxing the film on reaching ∈=100% and 150%. At ∈=170%, the resistance of the film increases irreversibly by several orders of magnitude. A lower limit on conductivity at 150% strain may be of 2,200 S cm$^{-1}$. Accordingly, various embodiments are directed to imparting reversible resistance increases by limiting strain amounts accordingly. For further discussion of conductivity under strain, and embodiments that may be incorporated, reference may be made to Appendix A in the underlying provisional application.

In accordance with one or more embodiments, this effect of strain history on resistance is used to program nanotube films by a first cycle of strain and release, to be reversibly stretchable within the range defined by the first strain. FIG. 1B shows an embodiment in which four cycles of strain are applied from 0 to 50%, in which the resistance increases reversibly by less than about 10%, where the film has been previously strained to about 50% or less.

FIG. 1C shows such an approach in which R varies over the course of 12,500 cycles of stretching per cycle, which can be used to implement an approach to set a desirably lowest available strain (e.g., at 1,500$^{th}$ cycle). In connection with this embodiment, it has been discovered that resistance is decreased by 22% at the 1,500th cycle, and then increased linearly, such that by setting a number of cycles to facilitate the exhibition of a fixed resistance to later applications of strain, yet below a value that increases resistance, desirable aspects can be achieved. This minimum in resistance value can be set to a period in which nanotube bundles adopt an optimum morphology (e.g., where subsequent cycles of stretching possibly decrease the number of conductive junctions between bundles).

FIGS. 2A-2D show a series of schematic diagrams depicting the change in morphology of nanotubes on a substrate 210 with strain, as may be implemented in various embodiments for achieving a desirable resistance. By way of example, the substrate 210 is shown as including PDMS, with reference to the formation of carbon nanotube nanostructures having random orientation. However, various embodiments are directed to such an approach with other types of nanostructures such as nanowires, and to other orientations (e.g., aligned to at least some degree).

Figure 2A:
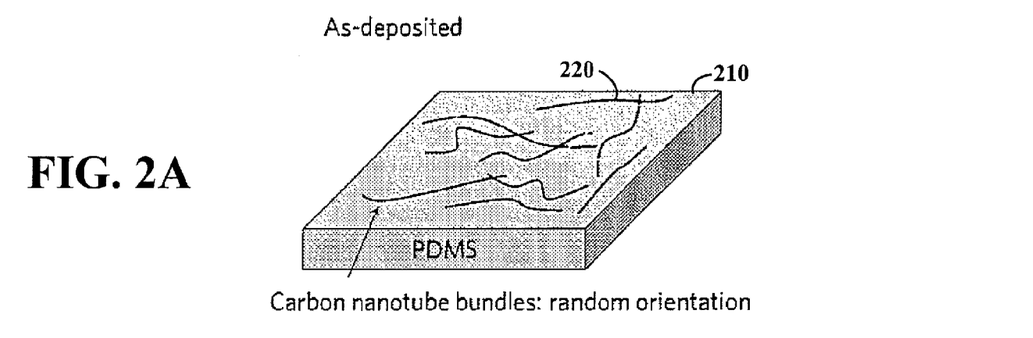

FIG. 2A shows a deposited film of nanotube bundles on a substrate 210, with nanotube 220 labeled by way of example. The nanotubes may, for example, have diameters in the range of 10-20 nm, and have with different (e.g., isotropic) orientations. In some embodiments, the surface of the substrate 210 is activated with ultraviolet/$O_3$ before deposition to facilitate slip, which can be useful with nanotube bundles of large, sparse aggregates non-uniformly distributed on hydrophobic substrates.

Figure 2B:
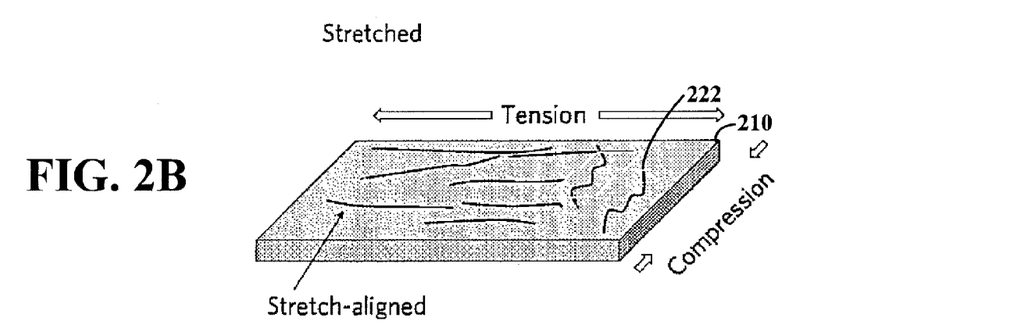

FIG. 2B shows the nanotube film under strain, with the substrate 210 being stretched along the tension lines shown. The application of strain exerts tensile stress on bundles with components oriented with the axis of strain, and aligns them to it. Compressive stress (due to the Poisson effect) on bundles oriented perpendicular to the axis of strain and along the compression lines shown causes the nanotubes to buckle in plane into waves (e.g., as shown at nanotube 222).

Figure 2C:
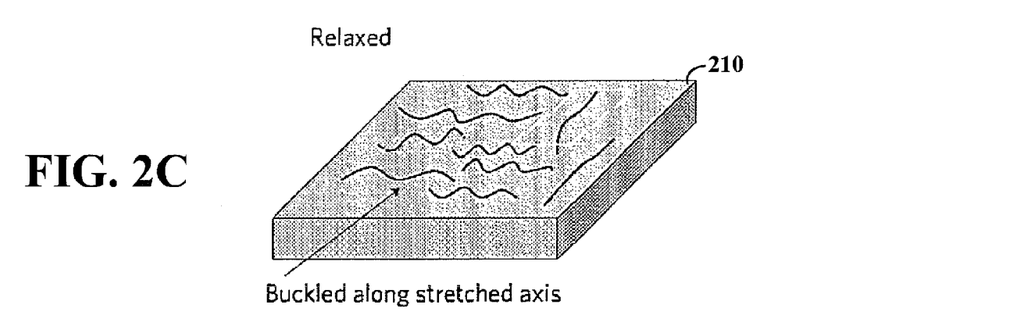

FIG. 2C shows an implementation in which, after stretching the nanotube film, the strain is relaxed to 0% to produce waves in the bundles that had been aligned by stretching. This buckling along the stretched axis is shown, with peak portions of the buckles being adhered or semi-adhered to the substrate 210. The amplitude of waves is increased by applying increased initial strain, such as described in the underlying provisional application.

Figure 2D:
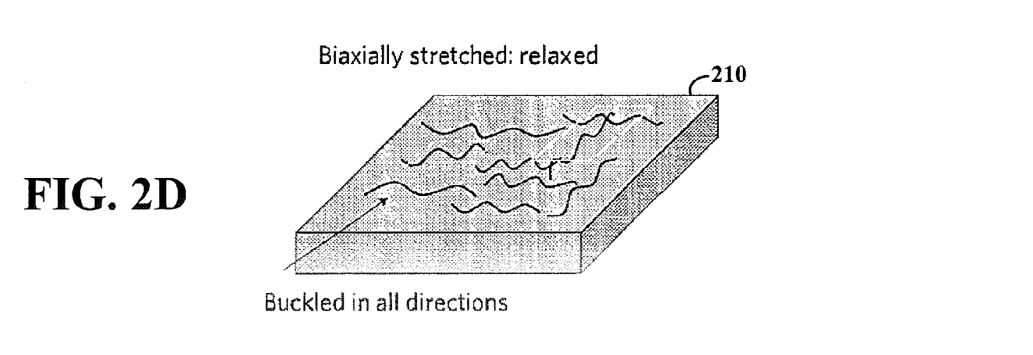

FIG. 2D shows an implementation in which biaxial stress is applied, such that two or more axes along the substrate 210 are stretched and released to impart buckling to all (or nearly all) nanotube bundles, with random orientations. As shown, nanotubes aligned in different directions are buckled, with the biaxial strain effecting a set resistance (e.g., within a range) to about all of the nanotubes along respective axes. Such reversible stretching may be desirably implemented for a variety of applications, such as to produce substrates with reversible stretching of nanostructures in multiple directions.

Figures 3A, 3B, 3C, 3D, 3E:
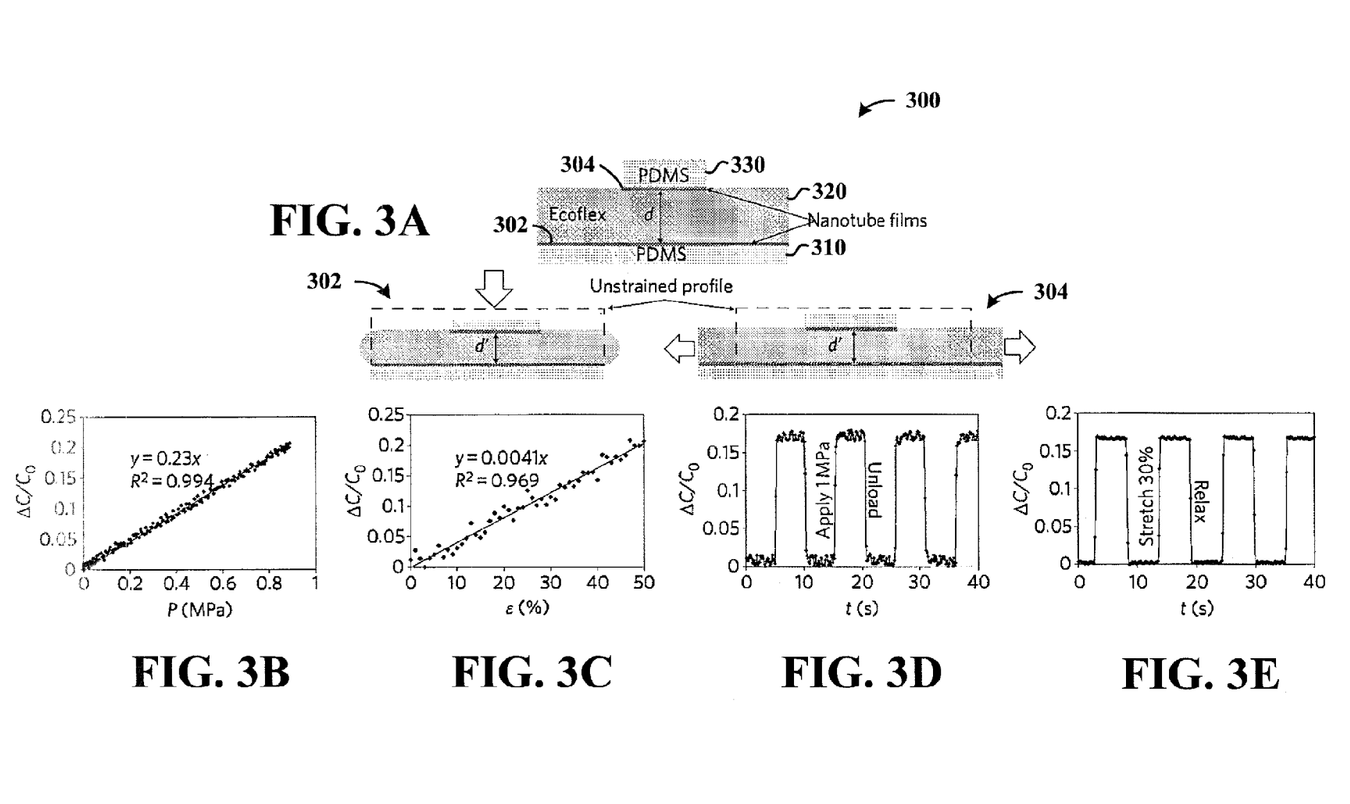
FIG. 3A shows a nanostructure apparatus, in accordance with another embodiment.
FIGS. 3B-3C respectively show plots of change in capacitance of the apparatus shown in FIG. 3A.
FIGS. 3D-3E show plots of change in capacitance of the apparatus shown in FIG. 3A over time.

FIG. 3A shows a nanostructure apparatus 300, in accordance with another embodiment. FIGS. 3B-3C respectively show plots of change in capacitance of the apparatus 300 versus pressure and strain, and FIGS. 3D-3E show plots of change in capacitance of the apparatus over time.

Beginning with FIG. 3A, an apparatus 300 includes upper and lower nanotube films 302 and 304 over a substrate 310. The nanotube films are separated by a flexible/compressible material 320, and another substrate portion 330 that may be implemented for applying pressure that is sensed. The nanotube films may, for example, be laminated together using a material such as a silicone elastomer (e.g., with a Shore hardness of 00-10), which may be more pliable than the substrate portions 310 and 330 (e.g., with Shore hardness of A-48) upon which the films may be formed. The resulting structure provides an indication of pressure, via changes in capacitance as the nanotube films are brought closer to one another and the material 320 is compressed, as relative to the distance between the film and dielectric characteristics of the material 320.

In some embodiments, each nanotube film 302 and 304 may be implemented as respective plates of a parallel-plate capacitor, with the material 320 providing capacitance therebetween. The capacitance of the parallel-plate capacitor is proportional to 1/d, where d is the spacing between plates. FIG. 3B shows the application of pressure (e.g., as at 302) and FIG. 3C shows tensile strain (e.g., as at 304), and involves a shortened distance between the electrodes (d').

Capacitance C is linearly dependent on pressure to 1 MPa and strain to 50% over the ranges indicated. The smallest change in capacitance distinguishable from noise is % 50 kPa. An exemplary figure of merit of conventional strain gauges is the gauge factor, $(\Delta R/R_0)/\in$, and capacitive gauge factor is given s $(\Delta C/C_0)/\in$, which is the slope of the linear fit as shown in FIG. 3C (e.g., as consistent with the underlying provisional application). As shown, $(\Delta C/C_0)/\in$ is 0.004.

FIG. 3D shows capacitance versus time for four cycles of applied pressure using an electrically insulating tip to apply the load, and FIG. 3E shows a similar plot of capacitance versus time over four cycles of stretching to 30%. The timescale over which the pixels recovered is smaller than 125 ms.

Figure 4:
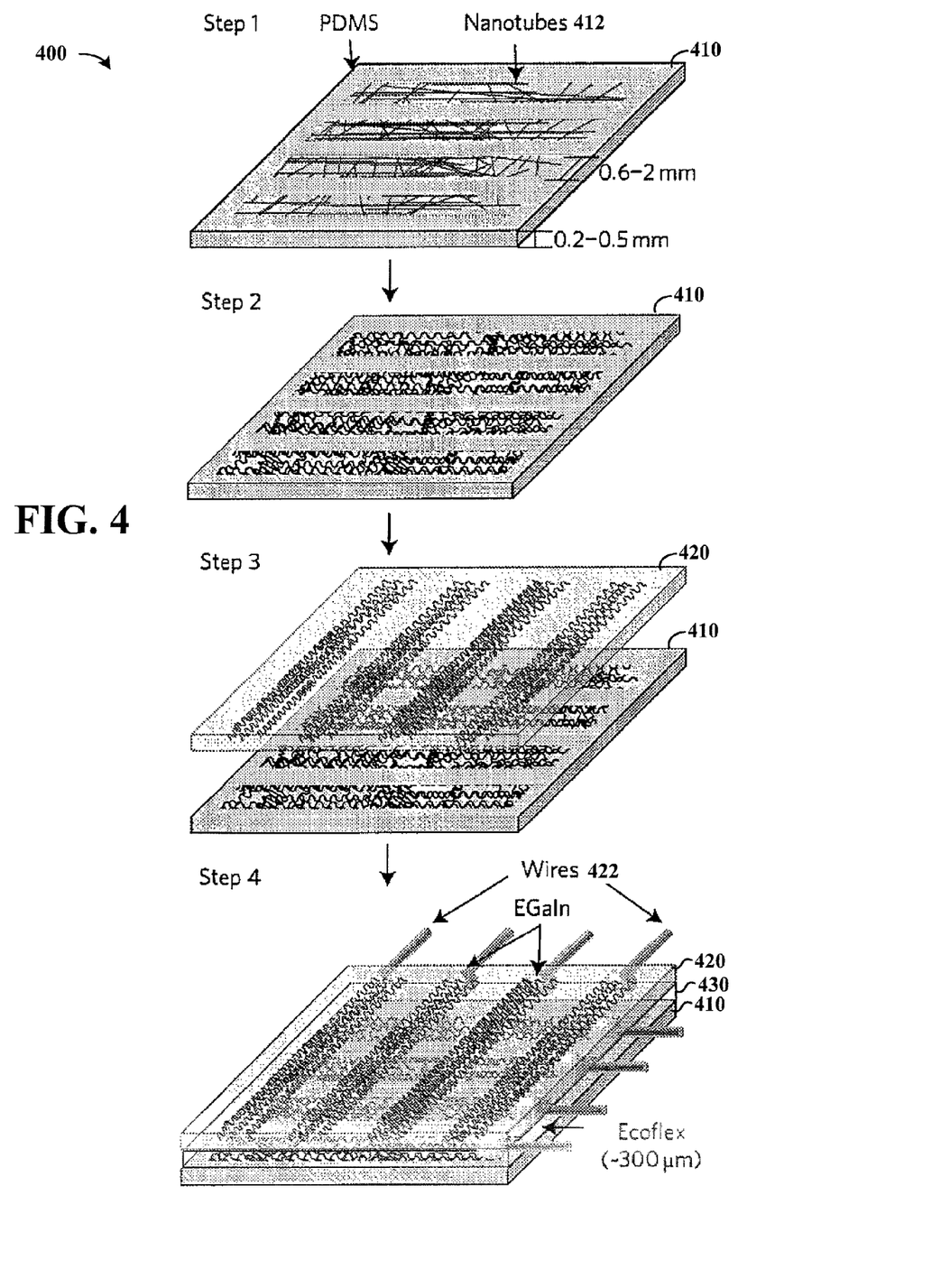
FIG. 4 shows an apparatus having a grid of capacitors, in accordance with another example embodiment.

FIG. 4 shows an apparatus 400 at respective stages of manufacture, in which a grid of capacitors on membranes 410 and 420 which are separated by a dielectric material 430, in accordance with one or more example embodiments. In step 1, nanotube lines 412 are deposited using a PDMS membrane 410 that contains apertures. Strain is applied to render the film reversibly stretchable at step 2. The second membrane 420 has nanotube lines orthogonal to the first membrane 410, and is and arranged relative to the first membrane at step 3.

A liquid eutectic gallium-indium (EGaIn) and copper wires (including wire 422 labeled by way of example) are placed at the ends of the respective nanotube lines, and the membranes are together with a dielectric material at step 4 (e.g., using Ecoflex available from BASF of Florham Park, N.J.). Using such an approach, patterns of nanotube films with line widths of 0.6-2 mm and pitches of 2-4 mm can be formed, with arrays of 4-64 capacitors (pixels') with areas of 0.4-4 $mm^2$ and pitches of 2-4 mm, and the thickness of the dielectric layer may be about 300 mm.

In some implementations, changes in capacitance due to strain are distinguished from those due to pressure, based upon the recognition that tensile straining affects pixels along the axis of strain and pressure affects the pixels in the immediate vicinity of the load. Crosstalk between adjacent pixels in the 64-pixel device can be held low, and the change in capacitance registered by a pixel on which pressure was applied can be five times higher than the average of that registered by four adjacent pixels. Using this recognition, stretchable materials can be used for pressure sensors, for which the greatest compression occurs at the site of the load.

In various embodiments, devices as discussed herein are monolithically integrated, mechanically compliant, physically robust and easily fabricated. Stretchable, transparent nanotube electrodes are prepared without dispersion in an elastic matrix, without pre-straining the substrate, and patterned using stencil masks. In some implementations, these materials and principles are used for organic, skin-like devices with other human—and superhuman—characteristics, such as the abilities to sense moisture, temperature, light and chemical and biological species.

Various embodiments and related apparatuses/components as discussed herein may be implemented using a variety of methods. In some embodiments, substrates upon which nanostructures are formed are prepared as followed. PDMS (Dow Corning Sylgard 184; ratio of base to crosslinker, 10:1 by mass) is mixed, degassed and poured against a polished surface of a silicon wafer bearing either a 300 nm thermal oxide or native oxide layer. Before first use, the surfaces of the wafers were activated with oxygen plasma (150 W, 60 s, 400 mtorr) and passivated with vapors of (tridecafluoro-1,1,2,2-tetrahydrooctyl)-1-trichlorosilane in a vacuum desiccator for ≥4 h. Curing in an oven at 60 8 C for 2 h produces PDMS membranes about 0.3 mm thick. These membranes are cut into squares or rectangles with a razor blade with lengths and widths of 2-8 cm.

Arc-discharge single-walled nanotubes (e.g., as available from Hanwaha Nanotech Corp.) are ultrasonicated in N-methylpyrrolidone at 30% power for 30 min. The solution is centrifuged for 30 min at 8,000 r.p.m. to remove large bundles, amorphous carbon or other contaminants. The top 75% of the solution is decanted for spray coating, to a final solution of a concentration of about 150 μg $ml^{-1}$. The nanotubes are spray coated using an airbrush (e.g., Master Airbrush, Model SB844-SET). In some implementations, characteristics of the spray coating are altered to set a contact angle to facilitate desirable strain (e.g., based upon an expected strain condition to be applied to the as-coated nanotubes). The PDMS substrates are first activated with ultraviolet/ozone for 20 min, then held at 180° C. on a hotplate, and the nanotubes are sprayed at a distance of about 10 cm using an airbrush pressure of 35 psi. A laser-cut PDMS membrane having long, parallel rectangular apertures (to produce parallel lines) is used as a stencil mask. Multiple passes of the airbrush (0.100) are performed until a desired transparency is reached. The patterned substrates are placed in a vacuum oven at 100° C. for 1 h to remove residual solvent. In some implementations, the surface is activated to form films in which the bundles of nanotubes are dispersed well (e.g., to address issues in which ultraviolet/ozone-treated PDMS substrates become more hydrophobic with strain, such as when stretching from 0 to 60%, a water contact angle increases from 70 degrees to 90 degrees).

Nanotube networks are doped, in accordance with one or more embodiments. A material such as F4TCNQ (TCI America) is dissolved to a concentration of 0.4 mmol in chloroform by bath sonication for 45 min to 1 h. The resulting bright yellow solution is filtered using a syringe filter before use. After fabrication, carbon nanotube networks are covered with sufficient solution to cover the sample surface. The solution is left to sit (e.g., 60 s), and excess is removed by spinning (e.g., at 3,000 r.p.m. for 40 s). Samples are air dried for at least 30 min.

In some implementations, capacitive arrays are fabricated as follows. PDMS substrates patterned with nanotubes are stretched to 25% before laminating with one another. An Ecoflex 0010 silicone elastomer (e.g., Smooth-On 0010, TFB Plastics, 1:1 base to crosslinker by volume) is mixed, degassed and spread (using a piece of PDMS membrane as a 'paintbrush') over the surface of one of the patterned substrates. A second substrate is oriented, face down, perpendicular to the first, and pressed down. Air bubbles and excess Ecoflex are expelled by rolling (e.g., using a roll of tape). Drops of EGaIn (Aldrich) are placed on one of the two exposed termini of each line, a copper wire is placed in each drop of EGaIn, and the EGaIn drops are embedded with additional Ecoflex. Curing at 100° C. for 1 h produces monolithic arrays of capacitive pressure sensors.

One or more embodiments may be implemented in accordance with, using and/or with applications involving aspects as described in the underlying provisional application, including the appendices that form part of the application and the references cited in the application, which are fully incorporated herein by reference.

Based upon the above discussion and illustrations, those skilled in the art will readily recognize that various modifications and changes may be made to the various embodiments without strictly following the exemplary embodiments and applications illustrated and described herein. For example, different types of nanostructures, different stretching orientations and/or directions, and different type of substrates may be used in accordance with various example embodiments. Further, the embodiments described herein, including those described in the underlying provisional application, may be implemented separately or in combination. Such modifications do not depart from the true spirit and scope of various aspects of the disclosure, including aspects set forth in the claims.

What is claimed is:

1. An apparatus comprising:
 a stretchable substrate;
 a plurality of nanostructures;
 while the nanostructures are adhered to the stretchable substrate, the stretchable substrate and the nanostructures are configured and arranged to be in
  a first stretched-substrate mode in which the nanostructures are characterized by a resistance corresponding to a strain in the nanostructures, the strain being imparted due to and as a function of the substrate having been stretched to a first degree; and
  a second mode in which the substrate is no longer stretched to the first degree and in which the nanostructures continue to be characterized as a function of the strain and the corresponding resistance and by the nanostructures having peak regions of buckled segments being adhered along a surface of the stretchable substrate.

2. The apparatus of claim 1, wherein the nanostructures include at least one type of nanostructure and include material having at least one of: carbon in the form of carbon nanotubes or carbon nanofibers, and conductive metal in the form of metallic nanowires.

3. The apparatus of claim 1, wherein
 the nanostructures are configured and arranged with a resistance that is set by a degree of the strain imparted to the nanostructures in the stretched substrate mode, and
 in the second mode, the nanostructures are configured and arranged to exhibit a resistance that varies less than about 25% from the resistance set in the first stretched-substrate mode.

4. The apparatus of claim 1, wherein the nanostructures are configured and arranged with a resistance that is set by the strain imparted to the nanostructures in the stretched substrate mode, and that varies less than about 25% from the resistance set in the first stretched-substrate mode under conditions in which the substrate is subjected to a degree of stretching that is between an un-stretched condition and the first degree of stretching.

5. The apparatus of claim 1, wherein the nanostructures are configured and arranged with the substrate to, in the second mode, stretch and release within a degree of stretching that is less than the first degree while maintaining the resistance of the nanostructures about constant.

6. The apparatus of claim 1, wherein the buckled segments are strained segments of the nanostructures that are configured and arranged to unbuckle upon stretching of the substrate toward the first degree while being adhered along the surface of the stretchable substrate.

7. The apparatus of claim 1, wherein the nanostructures are semi-adhesively coupled to the stretchable substrate, whereby the semi-adhesive coupling stretches the nanostructures in response to the stretchable substrate being stretched, and buckles the nanostructures in response to the stretchable substrate being released.

8. The apparatus of claim 1, wherein the nanostructures include nanowires, and the stretchable substrate and the nanostructures are configured and arranged to,
 in the first stretched-substrate mode, impart strain to the nanostructures in at least two directions along the surface of the stretchable substrate, and
 in the second mode, exhibit a resistance over a range of degree of stretching between about zero and the first degree of stretching that is one of: about constant, varies less than about 10%, and varies less than about 25%.

9. The apparatus of claim 1, wherein the stretchable substrate is configured and arranged to be reversibly stretched.

10. The apparatus of claim 1, wherein the nanostructures include high-aspect-ratio nanostructures having a length and thickness in which the length is at least ten times the thickness.

11. The apparatus of claim 1, wherein
 the nanostructures are a one-dimensional film of nanostructures semi-adhesively coupled to the surface of the stretchable substrate in the second mode, in which the film extends parallel to the stretchable substrate, and in which the nanostructures extend in a wave-like manner along a plurality of directions within the one-dimensional film, and
 the strain is a biaxial strain applied along different directions relative to the substrate.

12. The apparatus of claim 11, further including:
 a second stretchable substrate,
 a second plurality of nanostructures in a second one-dimensional film configured and arranged with the substrate to be in the first stretched-substrate mode and the second mode, and
 a stretchable material between the films and configured and arranged to store electrical charge based upon a degree of compression of the stretchable material, the respective films being configured and arranged to electrically interact with the stored electrical charge and provide an output indicative of the degree of compression via the stored electrical charge.

13. The apparatus of claim 12, further including a detector, including circuitry, coupled to the films and configured and arranged to use outputs from the respective films and an indicated pattern of pressure to determine a degree of extension or compression of the stretchable material.

14. The apparatus of claim 1, wherein the nanostructures include a hybrid structure having at least two different types of nanostructures and include material having at least one of:

carbon in the form of carbon nanotubes or carbon nanofibers, and conductive metal in the form of metallic nanowires.

15. A method comprising:
coupling a plurality of nanostructures to a stretchable substrate;
operating the nanostructures and the stretchable substrate in a first stretched-substrate mode in which the nanostructures are characterized by a resistance corresponding to a strain in the nanostructures, by imparting the strain via stretching of the substrate to a first degree; and
operating the nanostructures and the stretchable substrate in a second mode in which the substrate is no longer stretched to the first degree and in which the nanostructures continue to be characterized as a function of the strain and the corresponding resistance and by the nanostructures having peak regions of buckled segments being adhered along a surface of the stretchable substrate.

16. The method of claim 15, wherein operating the nanostructures and the stretchable substrate in the first stretched-substrate mode includes straining the nanostructures by stretching the stretchable substrate in at least one direction, thereby imparting the resistance to the nanostructures.

17. The method of claim 15, wherein
operating the nanostructures and the stretchable substrate in the first stretched-substrate mode includes straining the nanostructures by stretching the stretchable substrate in at least two directions, thereby imparting the resistance to the nanostructures, and
operating the nanostructures in the second mode includes using the strain to limit variations in resistance to less than about 25% under conditions in which the stretchable substrate is stretched to a degree that is less than or equal to the first degree.

18. The method of claim 15, wherein coupling the nanostructures to a stretchable substrate includes coupling a hybrid of at least two types of nanostructures to the stretchable substrate, and imparting the strain includes straining each of the at least two types of nanostructures.

19. The method of claim 15, wherein imparting the strain includes setting the resistance to a value that varies less than about 10% when operating in the second mode in which the substrate is stretched and relaxed between an un-stretched condition and the first degree of stretching.

20. The method of claim 15, wherein
the nanostructures have a length and a thickness, the length being at least ten times the thickness,
operating the nanostructures and the stretchable substrate in the first stretched-substrate mode includes using semi-adhesive coupling between the stretchable substrate and the nanostructures to strain the nanostructures as the stretchable substrate is being stretched, thereby deforming the nanostructures in length, and
operating the nanostructures and the stretchable substrate in the second mode includes buckling the segments by releasing the stretched substrate, in which the substrate returns to an un-stretched state, and using semi-adhesive coupling to cause buckling of the nanostructures.

21. The method of claim 15, wherein operating the nanostructures and the stretchable substrate in a first stretched-substrate mode includes iteratively manipulating the stretchable substrate to cyclically strain and relax the nanostructures, thereby setting a morphology of the nanostructures that sets strain-induced resistance to a range of values that is less than a strain-induced resistance of the nanostructures after a first cycle of straining and relaxing and that varies less than about 25%.

22. The method of claim 21, wherein iteratively manipulating the stretchable substrate includes stretching and buckling the nanostructures along at least two axes and imparting a wave-like structure to the nanostructures using semi-adhesive coupling between the substrate and the nanostructures to
allow a portion of the nanostructures to slip relative to the substrate while the nanostructures are strained via stretching of the substrate, and
buckle the nanostructures into the wave-like structure upon release of the stretched substrate,
wherein the wave-like structure has an amplitude of waves per length set based upon a degree to which the nanostructures are strained by the stretchable substrate.

23. The method of claim 15, wherein coupling a nanostructures to a stretchable substrate includes forming a semi-adhesive layer on the stretchable substrate and coupling the nanostructures to the semi-adhesive layer.

24. The method of claim 15, wherein operating the nanostructures and the stretchable substrate in a first stretched-substrate mode includes imparting strain-induced resistance to the nanostructures that is independent of a density of the nanostructures on the surface of the substrate.

25. The method of claim 15, further including removing the nanostructures from the stretchable substrate after operating the nanostructures and the stretchable substrate in a first stretched-substrate mode, and coupling the nanostructures in a circuit structure on a different substrate.

26. A method comprising:
imparting a resistance to a plurality of nanostructures coupled to a stretchable substrate by straining the nanostructures via stretching of the substrate to a first degree, using semi-adhesive coupling between the stretchable substrate and the nanostructures to strain the nanostructures, and
wherein imparting the resistance includes configuring and arranging the nanostructures with a range of resistances that varies less than 25% of a value of the imparted resistance while the substrate is stretched and relaxed between an un-stretched mode and a stretched mode in which the substrate is stretched to the first degree.

* * * * *